United States Patent [19]

Nakagawa et al.

[11] Patent Number: 4,567,502

[45] Date of Patent: Jan. 28, 1986

[54] PLANAR TYPE SEMICONDUCTOR DEVICE WITH A HIGH BREAKDOWN VOLTAGE

[75] Inventors: Akio Nakagawa, Amherst, Mass.; Tadashi Utagawa, Yokohama; Tsuneo Tsukakoshi, Zushi, both of Japan

[73] Assignee: Tokyo Shibaura Denki Kabushiki Kaisha, Kawasaki, Japan

[21] Appl. No.: 587,879

[22] Filed: Mar. 14, 1984

Related U.S. Application Data

[63] Continuation of Ser. No. 335,345, Dec. 29, 1981.

[30] Foreign Application Priority Data

Mar. 28, 1981 [JP]  Japan .................................. 56-45773

[51] Int. Cl.$^4$ ........................................... H01L 29/40
[52] U.S. Cl. ....................................... 357/53; 357/52; 357/23.4
[58] Field of Search ............. 357/53, 52, 23 VD, 23.4

[56] References Cited

U.S. PATENT DOCUMENTS 3,405,329 10/1968  Loro et al. ............................. 357/52
3,763,406 10/1973  Bosselaar ............................... 357/53

FOREIGN PATENT DOCUMENTS 49-36513 10/1974  Japan ...................................... 357/53
2087648  5/1982  United Kingdom .......... 357/23 VD Primary Examiner—Martin H. Edlow
Attorney, Agent, or Firm—Oblon, Fisher, Spivak, McClelland & Maier

[57] ABSTRACT

A planar type semiconductor device having a high breakdown voltage, including a diffusion region of a P type formed in a semiconductor layer of an N type, a guard ring region of the P type formed in the semiconductor layer and surrounding the diffusion layer, and an insulating film covering the surface of the semiconductor layer between the diffusion and guard ring region. A field plate is provided which is kept at a potential equal to that of the diffusion region. The field plate covers the entire surface of that portion of the insulating film which is between the diffusion and guard ring regions.

2 Claims, 6 Drawing Figures

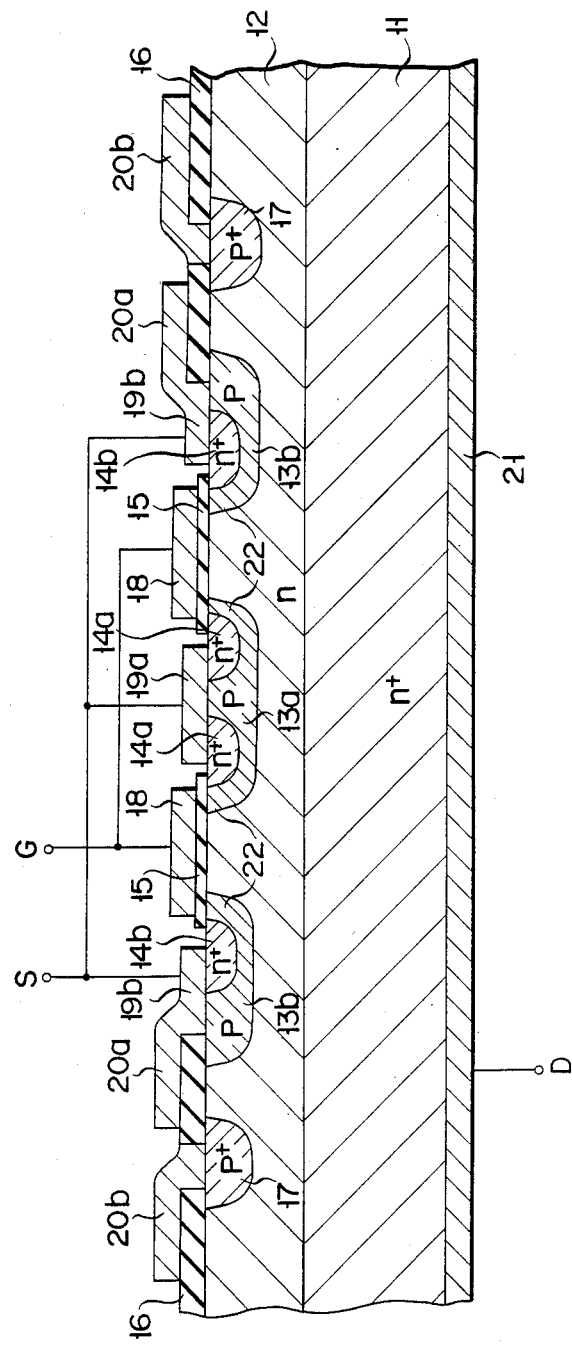
F I G. 5

PLANAR TYPE SEMICONDUCTOR DEVICE WITH A HIGH BREAKDOWN VOLTAGE

This application is a continuation of application Ser. No. 335,345, filed Dec. 29, 1981.

BACKGROUND OF THE INVENTION

The present invention relates to a planar type semiconductor device, and more particularly to a planar type semiconductor device with a high breakdown voltage having a field plate and a guard ring.

In general, a breakdown voltage of a planar type semiconductor device is lower than that of a mesa type semiconductor device. The reason for this is that, in the planar type semiconductor device, an electric field is concentrated mainly at a PN junction in the surface area of a semiconductor substrate, so that a breakdown voltage at the PN junction in the surface area is lower than that at the PN junction in the interior of the substrate. It is well known that a field plate or a guard ring is used as the means for improving a breakdown voltage of the planar type semiconductor device. A structure of a PN diode with a field plate, for example, is illustrated in FIG. 1 and a structure of a PN diode with a guard ring is illustrated in FIG. 2. In FIGS. 1 and 2, reference numeral 1 designates an N type semiconductor substrate, 2 a P+type diffusion area formed on the surface of the substrate 1, 3 an insulating film of SiO₂, for example, 4 an anode electrode, 5 a cathode electrode. In FIG. 1, a field plate 6 integral with an anode electrode 4 is provided on an insulating film formed outside the P+type diffusion area 2. When an inverse bias voltage −V is applied to the anode electrode 4 of the device shown in FIG. 1, a depletion layer formed in the substrate 1 takes a shape as indicated by the broken line. The field plate 6 weakens the intensity of the electric field concentrated at the PN junction in the surface area of the substrate 1, resulting in providing the diode with a high breakdown voltage. Referring to FIG. 2, a P+type guard ring region 7 is provided surrounding the P+type diffusion area 2 at a given interval therebetween. With this structure, when the depletion layer (as indicated by a dotted line) produced when an inverse bias voltage −V is applied to the anode electrode 4 grows to reach the guard ring region 7, the guard ring region 7 shares a given amount of the voltage, so that an electric field between the diffusion area 2 and the guard ring 7 is kept at a fixed value. An electric field larger than the fixed value is used for further extending the depletion layer beyond the guard ring region 7. Therefore, the concentration of the electric field at the PN junction in the surface area of the substrate 1 is relieved, allowing provision of diodes with a high breakdown voltage. If necessary, a plurality of guard ring regions 7, not a single region, may be provided.

When negative electric charges are attached onto the insulating film, a channel is formed in a part of the surface of the substrate 1 corresponding to the part of the insulating layer with the electric charges attached. The formation of the channel deteriorates the function of the guard ring 7, that is, the function to restrict an electric field between the diffusion region 2 and the guard ring region to a given value. Since the amount of the charge attached to the insulating layer 3 is not always constant, the conductivity of the channel formed by the charge is also not fixed. This results in an instability in the expansion of the depletion layer. In order to remove the instability, Japanese Patent Publication No. 36513/49 (1974) discloses a semiconductor device with a structure as shown in FIG. 3. In FIG. 3, first and second guard ring regions 7a and 7b are provided surrounding the P+type diffusion region 2. A field plate 8a kept at a potential equal to that of the guard ring region 7a and a field plate 8b kept at a potential equal to that of the guard ring region 7b are provided on the insulating layer 3, extending toward the diffusion layer 2. In the structure of the semiconductor device, when an inverse bias voltage is applied to the anode electrode 4, the guard ring regions 7a and 7b share given voltages. Therefore, the electric field concentration at the PN junction in the surface area of the diffusion region 2 is prevented. Further, the field plates 8a and 8b are kept at the potential equal to that of the guard ring regions 7a and 7b. For this reason, the instability of the expansion of the depletion layer due to the charge attachment to the insulating film 3 is prevented, providing stable semiconductor devices with a high breakdown voltage.

The semiconductor device shown in FIG. 3, however, has the following drawbacks. Firstly, there are optimum values in the distances between the diffusion region 2 and the first guard ring region 7a and between the first guard ring region 7a and the second guard ring region 7b. If the distances do not fall within the optimum values, respectively, a high breakdown voltage characteristic can not be obtained. Further, it is difficult to secure the optimum values of the distances in manufacturing the semiconductor devices. Secondly, when a low ON-resistance of the semiconductor device is required, the resistance of the semiconductor substrate 1 must be set small. It is as a matter of course that when the resistance of the substrate is small, the expansion of the depletion layer is small. Meantime, the field plates 8a and 8b are extended in a direction to interrupt the expansion of the depletion layer. In order that the guard ring regions 7a and 7b share given voltages, the distance between the diffusion layer 2 and the guard ring region 7a and the distance between two guard ring regions must be shortened. This will be discussed in detail. Let us consider a case to manufacture a semiconductor device in which the resistance of the substrate 1 is below 18 Ω·cm and the breakdown voltage is the order of several hundred volts. A thickness of the depletion layer extending from the diffusion layer 2 to the inner side of the substrate 1 when an inverse bias voltage is applied to the anode electrode 4, is small, compared to the case where the substrate 1 has the high resistance. Therefore, a desired high breakdown voltage can not be obtained of course. In order to make the depletion layer expand from the diffusion layer 2 to the guard ring region 7a before the inverse bias voltage reaches the breakdown voltage at the PN junction, the distance between the diffusion area 2 and the guard ring region 7a must be set small. For the same reason, the distance between the guard ring regions 7a and 7b must be set small. Therefore, the manufacturing of the semiconductor devices is difficult and the production yield of the semiconductor devices is decreased.

SUMMARY OF THE INVENTION

Accordingly, an object of the present invention is to provide a planar type semiconductor device which has a high breakdown voltage characteristic of about several hundreds Vonts when the resistance of the semiconductor substrate is relatively low and which can be manufactured at a good production yield.

A planar type semiconductor device with a high breakdown voltage according to the present invention has a diffusion region of a second conductivity type formed in a selected portion of a surface of a semiconductor layer of a first conductivity type, at least one guard ring region of the second conductivity type formed in the surface of the semiconductor layer, surrounding the diffusion region at a given distance, and an insulating film covering a given portion of the surface of the semiconductor layer, and is characterized by a first conductive layer which is provided on the insulating film formed outside the diffusion region and which is at a potential equal to that of the diffusion area, and by a second conductive layer which is provided on the insulating layer formed outside the guard ring region and which is kept at a potential equal to that of the guard ring region.

BRIEF DESCRIPTION OF THE DRAWINGS

FIG. 5 is a partial cross sectional view of an embodiment when a semiconductor device according to the present invention is applied for a DMOS (double-diffused metal oxide semiconductor) transistor;

DETAILED DESCRIPTION OF THE PREFERRED EMBODIMENT

Figure 1:
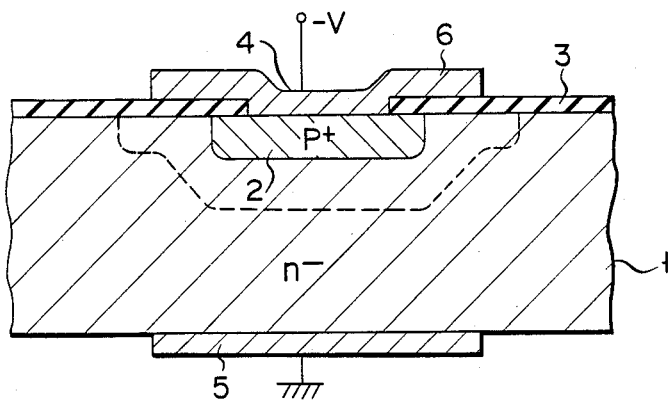
FIG. 1 is a partial cross sectional view of a prior PN junction diode with a field plate.
Figure 2:
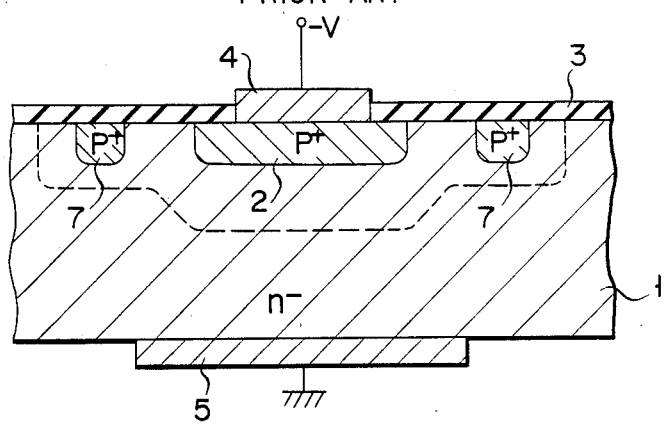
FIG. 2 is a partial cross sectional view of another prior PN junction diode with a guard ring region.
Figure 3:
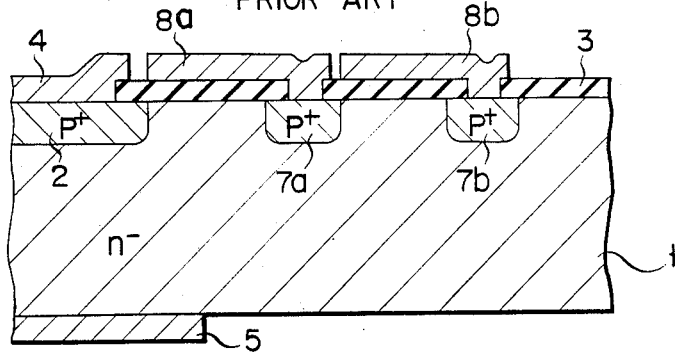
FIG. 3 is a partial cross sectional view of yet another prior PN junction diode with guard ring regions and field plates.
Figure 4:
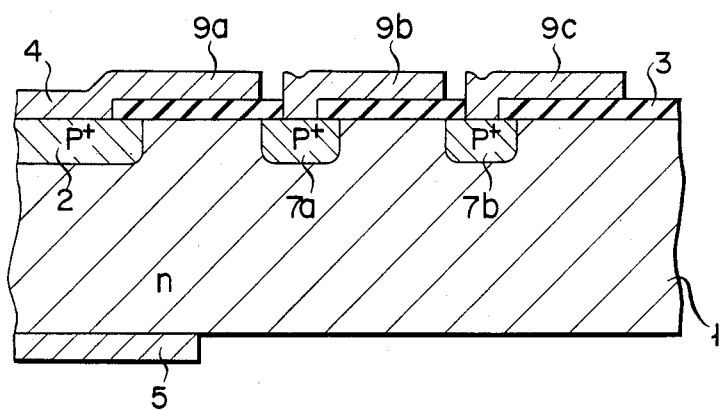
FIG. 4 is a partial cross sectional view of a PN junction diode for explaining the principle of the present invention.

Referring now to the drawings, wherein like reference numerals designate identical or corresponding parts throughout the several views, and more particularly to FIG. 4 thereof, there is shown an embodiment where the present invention is applied to a PN diode. In FIG. 4, on an upper surface of an N type semiconductor substrate 1 having a relatively low resistivity 18 Ω·cm or less, for example, there are formed a P+type diffusion region 2, a first guard ring region 7a surrounding the diffusion region 2 at a predetermined distance, and a second guard ring region 7b surrounding the region 7a at a predetermined distance. An anode electrode 4 is provided in contact with the diffusion region 2. An extended portion of the anode electrode 4, or a first field plate 9a is provided on an insulating layer 3 provided at the periphery of the diffusion region 2. The electrode in contact with the first guard ring region 7a is extended onto the insulating layer 3 provided outside the region 7a. The extended portion serves as a second field plate 9b. Further, the electrode contacting with the second guard ring region 7b is extended onto the insulating layer 3 provided outside the region 7b and the extended portion serves as a third field plate 9c. The first to third field plates 9a to 9c are extended in a direction which allows a depletion layer produced when an inverse bias voltage is applied to the anode electrode 4 to extend outwardly. In the structure shown in FIG. 4, potentials of the field plates 9a to 9c are lower than surface voltages of the substrate 1 right under these field plates. As a result, the extending rate of the depletion layer from the diffusion region 2 toward the outside is larger than that in the case of FIG. 3. Therefore, even when the resistivity of the substrate 1 is small, it is possible to manufacture a semiconductor device having a breakdown voltage of hundreds of volts or so, at a good production yield by allotting predetermined voltages to the guard ring regions 7a and 7b without reducing the distances between the diffusion region 2 and the first guard ring region 7a and between the second and third guard ring regions. Experiment conducted by inventors showed that diodes with a high breakdown voltage of more than 400 V could be manufactured at a high production yield with the structure shown in FIG. 4. Of course, it can solve the disadvantage of the device shown in FIG. 2.

In FIG. 4, it is found that, when the resistivity of the substrate 1 is relatively low, the potential difference between the diffusion region 2 and the first guard ring region 7a and the potential difference between the first and second guard ring regions are dependent on the thickness of the insulating layer 3, and not dependent on the distances between these regions. The fact will be theoretically analysed later referring to FIG. 6. The actual control of the thickness of the insulating layer 3 is very easy, and the fact that the potential differences are controllable by controlling the thickness makes the design of the semiconductor device remarkably easy. Therefore, the semiconductor devices with a high breakdown voltage may be manufactured at a good production yield.

An embodiment in which the present invention is applied to a DMOS (double-diffused metal oxide semiconductor) transistor with a breakdown of about 450 V and an ON-resistance of about 0.3 Ω, will be described referring to FIG. 5. In FIG. 5, reference numeral 11 designates an N+type Si substrate with a low resistivity provided on a drain electrode 21. The N+type substrate 11 makes up a drain region. An N type epitaxial layer 12 with a resistivity of 12 Ω·cm and a thickness of about 30 to 40 μm is formed on the substrate 11. In the layer 12, P type diffusion layer 13a and 13b serving as channel regions, and N+type diffusion layer 14a and 14b serving as source regions are formed. The channel regions and source regions are formed through a double diffusion process by self-alignment. A gate oxide film 15 is provided on the channel regions 22, and a gate electrode 18 is provided on the gate oxide film 15. A P+type guard ring region 17 is formed through the diffusion process, surrounding the outside P type diffusion layer 13b. The distance between the P type diffusion region 13b and the guard ring region 17 is about 10 μm. A source electrode 19a is provided contacting with the diffusion region 13a and the N+type diffusion layer 14a. A source electrode 19b is in contact with the P type diffusion region 13b and the N+type diffusion region 14b, and is extended onto an insulating film 16 provided on the outside of the P type diffusion region 13b. And the extended portion 20a is a first field plate corresponding to the first field plate 9a in FIG. 4. The electrode in contact with the P+type guard ring region 17 is extended onto the insulating layer 16 provided on the outside of the region 17. The extended portion 20b is a second field plate corresponding to the second field plate 9b in FIG. 4. The source electrodes 19a and 19b are commonly supplied with a source voltage, and the gate electrode 18 is applied with a gate voltage.

In the case of FIG. 5, a depletion layer extending outwardly from the P type diffusion region 13b easily reaches the guard ring region 17. The electric field between the diffusion region 13b and the guard ring region 17 is held at a substantially constant value, and the breakdown voltage of the DMOS can be made higher also in the case of FIG. 4. In the DMOS transistor having the structure shown in FIG. 5, the breakdown voltage between the drain and source is 450 V or more, and its ON-resistance is 0.3 Ω or less. Besides, the transistor can be manufactured at a yield rate of 90% or more. In a DMOS transistor fabricated under the same condition as that of FIG. 5, except that neither field plate 20a nor 20b is provided, the number of the transistors produced a breakdown voltage less than 450 V between the drain and source and a production yield of 50% or less. According to the present invention, a kind of synergism of the guard ring regions and the field plates reduces the number of the guard ring regions for obtaining a high breakdown voltage. Further, it is not necessary to make extremely small the distances between the diffusion region and the first guard ring region and between the guard ring regions. This implies that the production yield in the manufacturing process is improved.

Figure 6:
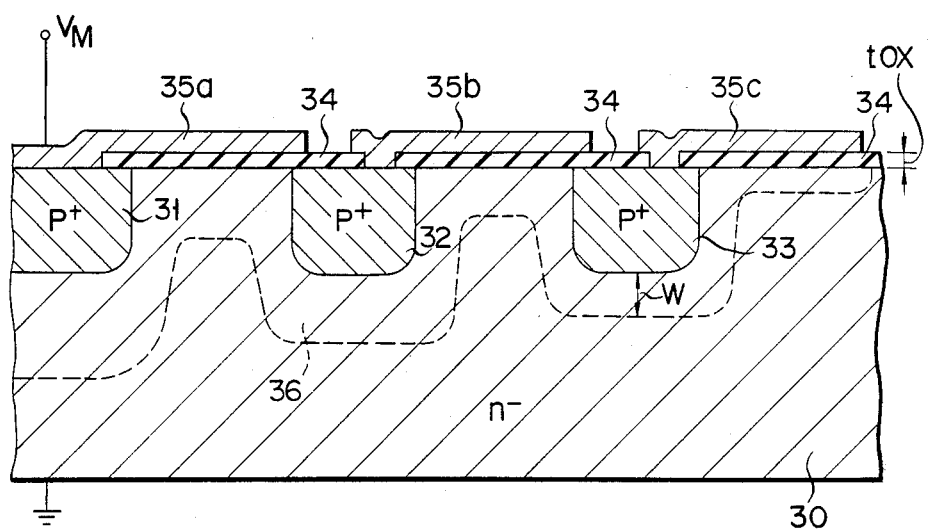
FIG. 6 is a cross sectional view of a PN junction diode for theoretically analyzing the characteristic of a semiconductor device according to the present invention.

Referring to FIG. 6, let us theoretically analyse the fact that the potential difference between the guard ring regions is a function of the impurity concentration $N_B$ of the semiconductor layer with these guard ring regions are provided and a thickness $t_{ox}$ of the insulating layer with the field plates. In FIG. 6, provided in an N⁻ semiconductor layer 30 grounded are a P⁺ type diffusion region 31, a P⁺ type first guard ring region 32 and a P⁺ second guard ring region 33 surrounding the diffusion region. A first field plate 35a integral with an anode electrode for applying an inverse bias voltage $V_M$ to the P⁺ diffusion region 31, a second field plate 35b having the equal voltage to that of a first guard ring region 32 and a third field plate 35c having the equal voltage to that of the second guard ring region 33 are provided on an insulating layer 34 with a thickness $t_{ox}$, extending in a direction shown in the figure. Reference numeral 36 designates a depletion layer. The voltage difference between the guard rings 32 and 33 is equal to that between the field plates 35b and 35c. Therefore, the voltage $V_1$ of the first guard ring 32 when the semiconductor layer 30 is grounded is given by equation (1), as follows:

$$|V_1| = |V_2| + V_{ox} \qquad (1)$$

where reference symbol $V_2$ indicates the voltage of the second guard ring 33, $V_{ox}$ the voltage across the oxide insulator 34 between the guard ring 33 and the field plate 35b. For ease of the explanation, assume that the PN junction of the guard ring 33 is flat and let us apply an abrupt flat junction approximation to the PN junction of the guard ring 33. Then, the voltage $V_2$ of the guard ring 33 is approximately given by an equation (2), as follows $$|V_2| = \frac{qN_B W^2}{2\epsilon_{si}} \qquad (2)$$

where $N_B$ is the impurity concentration of the n⁻ layer 30, W is the width of the depletion layer under the guard ring 33, $\epsilon_{si}$ is the dielectric constant of the layer 30 and q designates a unit charge. The ratio $V_2/V_{ox}$ is proportional to the ratio of a capacitance of the oxide layer 34 to a capacitance of the depletion layer 36. Therefore, an equation 3 holds.

$$\frac{|V_2|}{V_{ox}} = \left(\frac{\epsilon_{ox}}{t_{ox}}\right) \bigg/ \left(\frac{2\epsilon_{si}}{W}\right) \qquad (3)$$

where $\epsilon_{ox}$ is the dielectric constant of the oxide layer 34, $t_{ox}$ is the thickness of the oxide layer 36, as described above. Combining equations 1 to 3, we have the following equation 4:

$$|V_1 - V_2| = \frac{t_{ox}}{\epsilon_{ox}} [2\epsilon_{si} q N_B |V_2|]^{\frac{1}{2}} \qquad (4)$$

As seen from the equation 4, the potential difference between the first and second guard ring regions is expressed as a function of only the thickness $t_{ox}$ of the insulating layer 34, the impurity concentration $N_B$ of the N⁻ layer 30 and the voltage $V_2$ or $V_1$. This is true for the potential difference between the diffusion region 31 and the first guard ring region 32. In other words, the potential difference is not dependent on the spacing between the diffusion region 31 and the first guard ring region 32 or between the first and second guard ring regions. As already stated, this fact not only extremely simplifies the manufacturing process of the semiconductor devices with a high breakdown voltage, but also greatly improves the production yield of the semiconductor device. The reason for this is that when the semiconductor substrate has a low resistance, there is no need for shortening the distance between the diffusion region and the first guard ring or the guard ring regions to such a degree as to provide difficulty in manufacturing the semiconductor devices.

It is evident that the present invention is applicable for other semiconductor device such as bi-polar transistors and thyristors.

What we claim is:

1. A planar type semiconductor device having a high breakdown voltage, including:
    a diffusion region of a second conductivity type formed in a selected surface portion of a semiconductor layer of a first conductivity type;
    at least a first guard ring region of the second conductivity type formed in another surface portion of said semiconductor layer surrounding said diffusion region at a given distance;
    an insulating film covering a given portion of the surface of said semiconductor layer;
    a first conductive layer provided on that portion of said insulating film formed on the surface of said semiconductor layer between said diffusion region and said guard ring region, said first conductive layer kept at a potential equal to that of said diffusion region and covering the entire surface of that portion of said insulating film which is between said diffusion region and said guard ring region; and
    a second conductive layer provided on that portion of said insulating film formed on the surface of said semiconductor layer surrounding the first guard ring region, said second conductive layer kept at a potential equal to that of said first guard ring region and away from said diffusion region extending outwardly.

2. A planar type semiconductor device as claimed in claim 1, comprising:

a second guard ring region of the second conductivity type surrounding said first guard ring region at a given distance;

said insulating film surrounding said first guard ring region formed on the surface portion of said semiconductor layer between said first and second guard ring regions; and said second conductive layer provided such that it covers the entire surface of that portion of said insulating film which is between said first and second guard ring regions.

* * * * *